(12) United States Patent
Pon et al.

(10) Patent No.: US 9,655,265 B2
(45) Date of Patent: May 16, 2017

(54) ELECTRONIC MODULE

(71) Applicant: Infineon Technologies AG, Neubiberg (DE)

(72) Inventors: Tiam Meng Pon, Melaka (MY); Theng Chao Long, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 14/287,083

(22) Filed: May 26, 2014

(65) Prior Publication Data
US 2015/0342073 A1 Nov. 26, 2015

(51) Int. Cl.
| | |
|---|---|
| H01R 9/00 | (2006.01) |
| H05K 7/02 | (2006.01) |
| H05K 3/32 | (2006.01) |
| H01L 23/64 | (2006.01) |
| H01L 25/07 | (2006.01) |
| H01L 23/495 | (2006.01) |
| H01L 23/50 | (2006.01) |
| H01L 23/31 | (2006.01) |
| H01L 23/00 | (2006.01) |

(52) U.S. Cl.
CPC .......... *H05K 7/02* (2013.01); *H01L 23/49562* (2013.01); *H01L 23/50* (2013.01); *H01L 23/64* (2013.01); *H01L 23/645* (2013.01); *H01L 25/07* (2013.01); *H05K 3/32* (2013.01); *H01L 23/3107* (2013.01); *H01L 24/83* (2013.01); *H01L 2224/291* (2013.01); *H01L 2224/32245* (2013.01); *H01L 2224/33181* (2013.01); *H01L 2224/48091* (2013.01); *H01L 2224/4903* (2013.01); *H01L 2224/49111* (2013.01); *H01L 2224/83801* (2013.01); *H05K 2203/0703* (2013.01); *H05K 2203/1305* (2013.01); *Y10T 29/49131* (2015.01); *Y10T 29/49147* (2015.01)

(58) Field of Classification Search
USPC ............... 361/760–763, 782–784, 803, 767, 361/776–777; 257/288
See application file for complete search history.

(56) References Cited

U.S. PATENT DOCUMENTS

| | | |
|---|---|---|
| 5,347,158 A | 9/1994 | Matsuda et al. |
| 6,828,506 B2 | 12/2004 | Murakami |
| 2005/0051814 A1* | 3/2005 | Miyake ............ H01L 21/823425 257/288 |
| 2012/0106220 A1* | 5/2012 | Yamaguchi ............ H05K 7/209 363/131 |

* cited by examiner

Primary Examiner — Tuan T Dinh

(57) ABSTRACT

An electronic module is provided, comprising an electronic chip arranged in the electronic module and comprising an input terminal and an output terminal; a first current path electrically connected to the input terminal; a second current path electrically connected to the output terminal; and an insulation arranged between the first current path and the second current path, wherein the first current path and the second current path extend in the same direction and arranged in close proximity to each other.

14 Claims, 4 Drawing Sheets

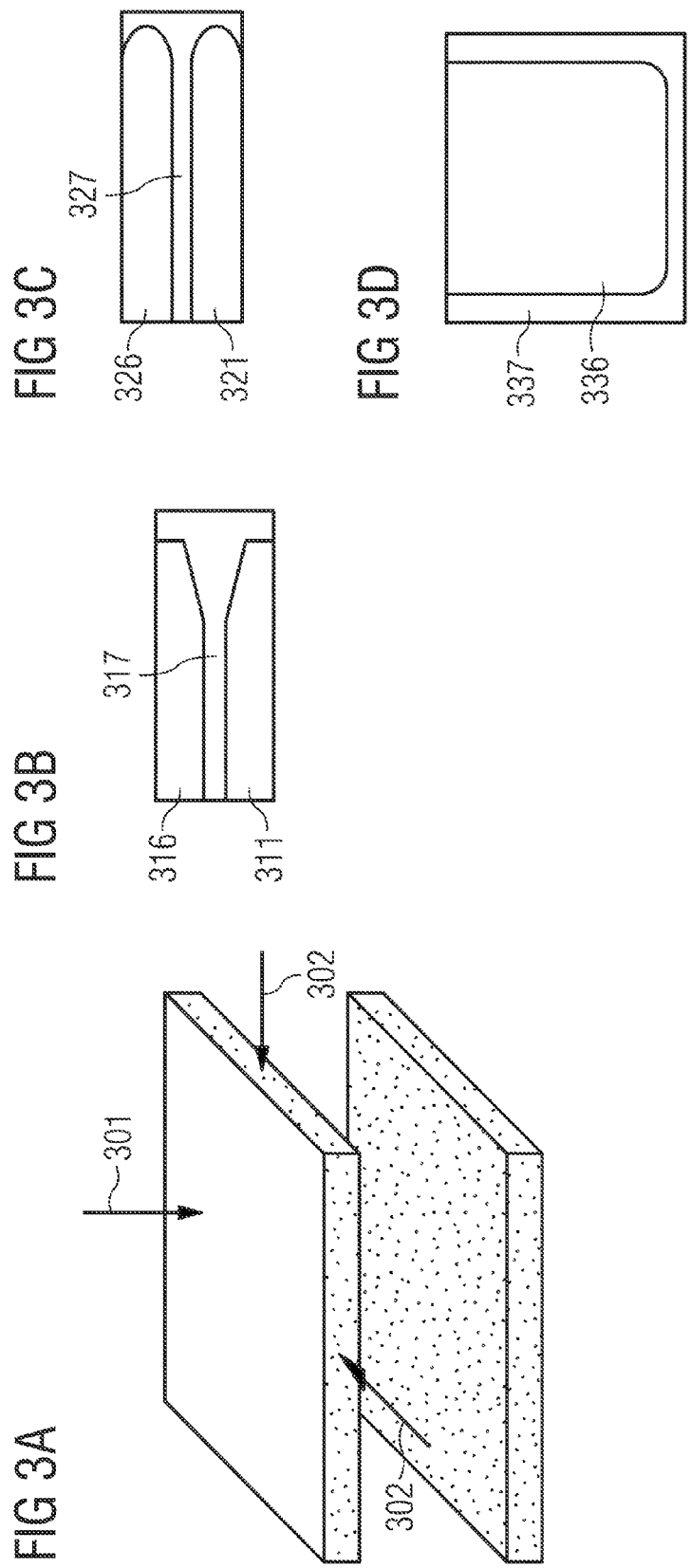

ELECTRONIC MODULE

TECHNICAL FIELD

Various embodiments relate to an electronic module, and method of manufacturing an electronic module.

BACKGROUND

In many technical fields electronic modules, e.g. so called power modules, are used for providing or switching power to electrical components or devices. One possible field is the automotive field or uninterruptible power supplies, for example. Most of the power modules comprise at least one transistor, e.g. an IGBT (insulated gate bipolar transistor) or a MOSFET. Typically the electronic modules are provided in the form of so called packages comprising a housing or an encapsulation formed by a mold compound, for example.

At the present state of the art the packages or modules contribute to a large extend to the so called stray inductance or electromagnetic interference and the corresponding parasitics effect due to relative long conductor or current paths. Furthermore, the stray inductance and electromagnetic interference is increased when the amount of current flowing through the electronic module is increased, which increase is desired in many application.

SUMMARY

Various embodiments provide an electronic module, comprising an electronic chip arranged in the electronic module and comprising an input terminal and an output terminal; a first current path electrically connected to the input terminal; a second current path electrically connected to the output terminal; and an insulation arranged between the first current path and the second current path, wherein the first current path and the second current path extend in the same direction and arranged in close proximity to each other.

Furthermore, various embodiments provide an electronic module, comprising a die arranged in the electronic module and comprising a first terminal and a second terminal; a first current path electrically connected to the first terminal; a second current path electrically connected to the second terminal and extending parallel to the first current path; and an insulation arranged between the first current path and the second current path, wherein a current in the first current path flows in the opposite direction to a current flowing in the second current path.

Moreover, various embodiments provide a method of manufacturing an electronic module, the method comprising providing a carrier comprising a first current path; forming an insulator on the first current path; arranging an electronic chip on the carrier and contacting the first current path; arranging a second current path on the insulator and contacting the electronic chip.

BRIEF DESCRIPTION OF THE DRAWINGS

In the drawings, like reference characters generally refer to the same parts throughout the different views. The drawings are not necessarily to scale. Instead emphasis is generally being placed upon illustrating the principles of the invention. In the following description, various embodiments are described with reference to the following drawings, in which:

FIGS. 3A to 3D schematically show details of electronic modules according to exemplary embodiments;

DETAILED DESCRIPTION

Figure 1:
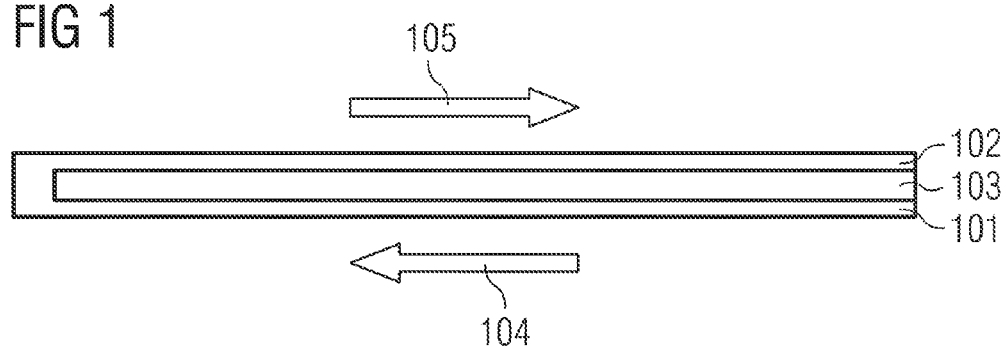
FIG. 1 schematically shows a principle layout of current paths which can be used in an electronic module according to an exemplary embodiment.

In the following further exemplary embodiments of an electronic module, an electronic system, and a method of manufacturing an electronic system will be explained. It should be noted that the description of specific features described in the context of one specific exemplary embodiment may be combined with others exemplary embodiments as well.

The word "exemplary" is used herein to mean "serving as an example, instance, or illustration". Any embodiment or design described herein as "exemplary" is not necessarily to be construed as preferred or advantageous over other embodiments or designs.

Various exemplary embodiments provide an electronic module comprising a die arranged in the electronic module and comprising a first terminal and a second terminal; a first current path electrically connected to the first terminal; a second current path electrically connected to the second terminal the electronic chip, wherein the first current path and the second current path are arranged with respect to each other that during operation of the electronic module stray inductances induced by the first and second current paths are at least partially canceling each other.

In particular, the electronic module may comprise a transistor, e.g. a power transistor, i.e. a transistor adapted to withstand a current of more than 1 A, more than 10 A or even more than 50 A. The current paths may be currents paths which are arranged, disposed, printed or formed on a support structure, e.g. by using deposition and/or patterning techniques, or may be a self-supporting structure, like a lead of a leadframe. The term "current paths" may particularly denote an element or structure adapted to guide or conduct an electrical current. In particular, the current paths may be formed by connectors, leads, pins, conductor paths or the like. For clarity reasons it should be noted that the term current path relates to the physical structure itself and has to be distinguished from the actual current flow which flows through the current path and may be in principle in both directions through the current path. In particular, the current flow may be in one direction in the first current path and in the opposite direction in the second current path.

Furthermore, the first current path and the second current path may be arranged in close proximity. The term "close proximity" may particularly denote that the elements being in close proximity, e.g. the first and second current paths, may be arranged in such a way that when current is flowing through the current paths in opposite direction may cancel or at least substantially cancel parasitics effects induced by the flowing current. Furthermore, it should be noted that the arrangement of the two current paths may be side by side or on top of each other. For example, only the insulator or isolation is arranged between the current paths. Thus, the distance between the two current paths may be defined by the thickness of the insulator, e.g. an isolation layer having e.g. a thickness below 5000 micrometer, below 250 micrometer, or even below 125 micrometer, e.g. between 1 micrometer and 500 micrometer, or between 1 micrometer and 250 micrometer. Depending on the situation or intended application the thickness of the insulation layer may be even below these values. In principle, it may be advantageous to arrange the two currents paths as close together as possible (in order to achieve a good cancellation of the parasitics effects) but depending on the intended voltage of course the insulation layer has to ensure the electrical insulation of the two current paths.

In particular, the electronic module may comprise a plurality of dies and/or electronic chips. In particular, the die may comprise a transistor, preferably the transistor may be a power transistor, e.g. an IGBT or a FET like a MOSFET. However, different electronic chips may be used as well, e.g. normal or signal transistors, and/or the electronic module may form an RF device, for example by implementing one or more RF amplifier and/or one or more RF (IC) chips. In particular, the electronic module may form an RF small signal variant.

For example, one of the current paths may be contacted to an input terminal or input contact of the electronic chip while the other is contacted to an output terminal or contact of the electronic chip. Preferably, the first current path and the second current path may be arranged parallel or substantially parallel to each other. Thus, it may be possible that electromagnetic parasitics may be reduced due to a canceling effect of the currents conducted through the currents paths in opposite directions. In particular, the carrier may be a leadframe, e.g. of copper or any other suitable electrically conductive material, providing a support structure and the first current path at the same time.

By arranging two current paths carrying or conducting electrical currents in opposite directions in close proximity it may be possible that detrimental or parasitics electromagnetic effects may be reduced. For example, stray inductance of the electronic module may be reduced or even cancelled by canceling the effects of the singles current paths. While one current path may generate an electromagnetic field having one orientation the other current path may generate an electromagnetic field having the opposite direction or orientation. Thus, the superimposing of the two fields may lead to a cancellation of the effects of the electromagnetic field. The reduction of the effects may also enable an improved performance at higher frequencies, e.g. by reducing potential overshoot and/or oscillations. It may also enable higher efficiency, e.g. due to faster switching and/or lower losses. Furthermore, higher power capability may be enabled by allowing to use wider conductive leads or plates as current paths without increasing stray inductance or electromagnetic interference effects.

In the following exemplary embodiments of the electronic module are described. However, the features and elements described with respect to these embodiments can be combined with exemplary embodiments of the method of manufacturing the electronic module as well.

According to an exemplary embodiment of the electronic module the insulator is formed by an insulating layer having a thickness of less than 500 micrometer. In particular, the thickness may be less than 250 micrometer, 125 micrometer, 50 micrometer or even less than 25 micrometer, e.g. 12.5 micrometer. The thickness may be in particular in the range between 0.1 micrometer and 500 micrometer, e.g. between 1 micrometer and 250 micrometer. However, it should be mentioned that the thickness may be as low as possible for providing a desired or necessary insulation of the two current paths.

According to an exemplary embodiment of the electronic module the insulator is adapted to withstand a voltage of at least 100 V.

In particular, the insulator may be adapted to withstand a voltage of about 1 kV or even more. For example, when using a fluorocarbon film as the insulator a thickness of about 12.5 micrometer may be appropriate to withstand a voltage of about 100 V while a film of about 125 micrometer may be appropriate to withstand a voltage of about 1 kV.

According to an exemplary embodiment of the electronic module the insulator comprises at least one material out of the group consisting of: silicon nitride; polyimide; fluorocarbon; and fluoropolymer. However, every other suitable insulating material may be used instead. The material may be selected based on the ability to withstand a predetermined threshold voltage given by desired application of the electronic module.

According to an exemplary embodiment of the electronic module the electronic chip comprises a transistor and the first current path is connected to a first switched terminal of the transistor and the second current path is connected to a second switched terminal of the transistor.

For example, in case of a field effect transistor (FET), e.g. a MOSFETs, the first switched terminal may be a source terminal, while the second switched terminal may be a drain terminal, or the other way around. In case of an insulated-gate bipolar transistor (IGBT), the first switched terminal may be a collector terminal, while the second switched terminal may be an emitter terminal, or the other way around. It should be noted that when using the arrangement of the current paths adapted to cancel at least partially electromagnetic interferences the principle layout, e.g. a pin arrangement of the same, may be unchanged.

According to an exemplary embodiment of the electronic module the first current path and the second current path are soldered to the electronic chip.

According to an exemplary embodiment the electronic module further comprises a heatsink thermally connected to at least one of the first current path and the second current path.

In particular, the heatsink may comprise two portions or sub-heatsinks wherein one portion is thermally connected to the first current path while the other portion is thermally connected to the second current path. Thus, a double side cooling may be enabled.

According to an exemplary embodiment the electronic module further comprises an encapsulation encapsulating the electronic chip at least partially.

In particular, the encapsulation may encapsulate the first and second current paths as well. In particular, the encapsulation may comprise a mold compound, an epoxy material or the like.

According to an exemplary embodiment the electronic module further comprises a further electronic component arranged in the encapsulation.

In particular, the electronic component may be a capacitor, which may be usable for providing standby power or the like.

According to an exemplary embodiment of the electronic module the encapsulation comprises a contact hole.

In particular, the contact hole may be adapted in such a way that the first contact path and/or the second contact path can be electrically contacted. Thus, it may be possible to electrically contact or connect an external electric or electronic component (e.g. a capacitor) to the encapsulated electronic chip or contact paths. In particular, this may enable that the external electric or electronic component is arranged close or near to the first and/or second current paths.

According to an exemplary embodiment of the electronic module the encapsulation comprises a fixing feature.

In particular, the fixing feature may be a screw hole suitable for fixing the electronic module to an external support structure or carrier. Alternatively or additionally, the fixing feature may be a predetermined area at which the electronic module may be soldered or adhered in another way to an external support structure or carrier.

According to an exemplary embodiment of the electronic module the insulator is arranged on a side portion of the first current path.

In particular, the insulator may be arranged not only between the first current path and the second current path but may be arranged on more sides of the current paths and/or electronic module. Thus, it may be possible to enable the use of the electronic module in high voltage applications or devices.

According to an exemplary embodiment of the electronic module at least one of the first and second current paths is formed by a straight current path.

In particular, both current paths may be formed by a straight current path or conductor. That is, the current paths may be formed by a lead of a leadframe or another kind of pin, wherein the lead or pin is not bent or staged, leading to a current flowing in a straight direction which may improve a cancelling of parasitics effects in the electronic module. Alternatively or additionally at least one of the current paths may comprise a step, or bent leading to a curved or staged current path. The step or bent may in particular be arranged in an encapsulation of the electronic module.

According to an exemplary embodiment the electronic module comprises a plurality of electronic chips each electrically connected to a first current path and a second current path.

In particular, the plurality of electronic chips may be identical and/or different electronic chips, wherein each of the electronic chips comprises an input terminal and an output terminal which is electrically connected to a first current path and a second current path, respectively forming a pair of current paths, i.e. may form an expanded configuration. Each pair of current paths are arranged in the above described way, i.e. in close proximity to each other and/or adapted in such a way that the current flows in opposite directions in the first current path and the second current path. In each pair of current paths the first current path and the second current path may be arranged side by side or on top of each other in close proximity. It should further be noted that each of the electronic chip and respective circuitry may form a sub-module, i.e. the electronic module may comprise a plurality of sub-modules.

In the following exemplary embodiments of the method for manufacturing an electronic module are described. However, the features and elements described with respect to these embodiments can be combined with exemplary embodiments of the electronic module.

According to an exemplary embodiment of the method the forming of the insulator is performed by a selective pre-coating step.

In particular, the selective pre-coating step may be performed in such a way that at least a surface of the first current path on which the second current path is afterwards arranged is covered by an insulating material. Thus, the insulating material may form an electrical insulating layer between the first and the second current paths.

According to an exemplary embodiment of the method the arranging of the second current path includes a bonding step.

For example, the bonding step may be a wire bonding step, a clip bonding step, or a solder bonding step.

According to an exemplary embodiment the method further comprises encapsulating the electronic chip and the first and second current paths at least partially.

In particular, the encapsulation may be formed by an encapsulating material, like a mold or epoxy material. The encapsulation may particularly function as an insulation and/or passivation.

According to an exemplary embodiment the method further comprises plating the electronic module to provide contact areas.

Summarizing an idea of an exemplary embodiment may be seen in providing an electronic module, e.g. a power module, comprising a transistor connected to two current paths arranged substantially parallel to each other and function as an input power path and an output power path. Thus, the current may flow in opposite directions through the current paths leading to a superimposing of the respective electromagnetic field and thus to a cancellation of the effects of these stray electromagnetic fields or stray inductances. Thus, it may be possible that potential overshoot and oscillation may be reduced at higher frequencies and that the electronic module may have a higher efficiency, e.g. by enabling faster switching and lower losses, and may increase the power capability, e.g. by enabling wider conductive plates or leads for the current paths. According to some specific embodiments a dual side heatsink cooling may be possible for the electronic module. For example, when using a transistor as an electronic chip or die for the electronic module, a drain contact may be arranged at the bottom side of the electronic module and a source contact may be arranged at the top of the electronic module, while both sides may still be solderable.

In the following exemplary embodiments of an electronic module and of a method of manufacturing an electronic module according to exemplary embodiments are described in connection with the figures.

FIG. 1 schematically shows a principle layout of current paths which can be used in an electronic module according to an exemplary embodiment. In particular, FIG. 1 shows a first current path 101 and a second current path 102 which are separated or insulated from each other by a thin insulator or insulation film 103. It should be noted that the current paths may be formed by relative small conductors or by conductor plates, i.e. relative broad or wide conductors. On the left side of FIG. 1 the first current path and the second current path are schematically connected with each other. In a real device like an electronic module the connection may be formed by an electronic chip, for example. In operation a current flowing through the first and second current paths flows in opposite direction which is indicated in FIG. 1 by the arrows 104 and 105. Thus, electromagnetic fields generated by each of the current paths cancel each other at least partially so that a relative low stray inductance or electromagnetic interference effects may be achievable.

Figure 2A:
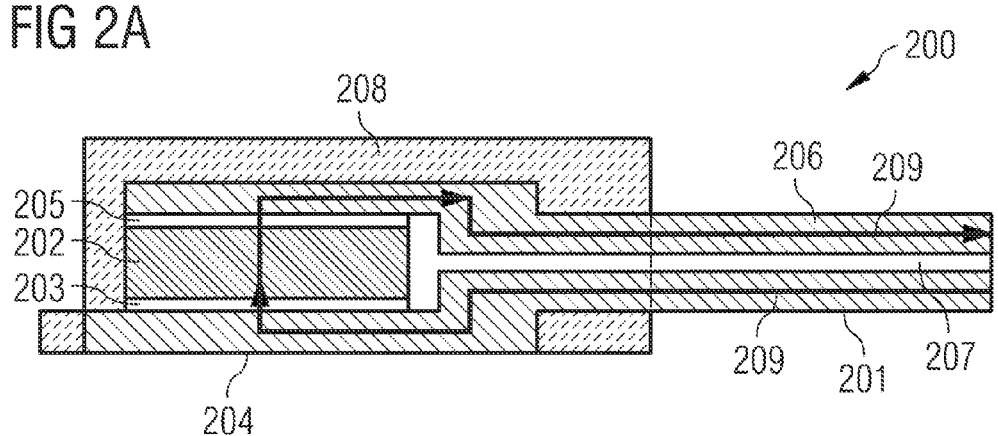
FIGS. 2A to 2D schematically show electronic modules according to different exemplary embodiments.

FIGS. 2A to 2D schematically show electronic modules according to different exemplary embodiments. In particular, FIG. 2A shows a first principle layout of an electronic module 200 according to an exemplary embodiment. The electronic module 200 comprises a first current path 201, e.g. a drain contact, which is electrically and thermally connected to a drain terminal of a transistor 202 of a die or electronic chip by a thin solder layer 203. A portion of the first current path 201 may form a heatsink or heatsink portion 204.

A source terminal of the transistor 202 is connected by a further thin solder layer 205 to a second current path 206 forming a source contact of the electronic module 200. In addition a thin insulator or isolation layer 207 is arranged between the first and second current paths electrically isolating the same from each other. The insulator may comprise or may consist of any suitable insulating material like silicon nitride, polyimide, a fluorocarbon film (of about 12.5 micrometer for example), or a fluoropolymer. Such a film of about 12.5 micrometer may be sufficient to withstand a voltage of about 100 v while a thickness of 125 micrometer may be sufficient to withstand a voltage of about 1 kV. It should be noted that the thickness of the insulator may be selected depending on the desired voltage used for the electronic module.

It should be noted that the heatsink portion of the electronic module and the first current path may be formed by a single plate or element or may be formed by two distinct elements electrically connected to each other by any suitable electrical connection, e.g. by wire bonding or clip bonding techniques. The same holds true for the second current path. In general, the electrical connections between the current paths and the electronic chip or die may be formed by any suitable method. That is, the above described solder layers 203 and/or 205 may be replaced by a bonding wire or clip wire connection, as later shown in FIG. 4.

Furthermore, the electronic module 200 comprises an encapsulation 208 encapsulating the electronic chip and portions of the first and second current paths. It should be noted that the current paths 201 and 206 are bent or staged according to the exemplary embodiment of FIG. 2.

In operation, a current is flowing through the first current path 201 and the second current path in opposite direction which is indicated by the arrows 209. Since the first and second current paths are arranged in close proximity to each other (only separated by the thin insulator 207) the electromagnetic fields generated by the current flowing through the current paths may cancel each other out at least substantially.

Figure 2B:
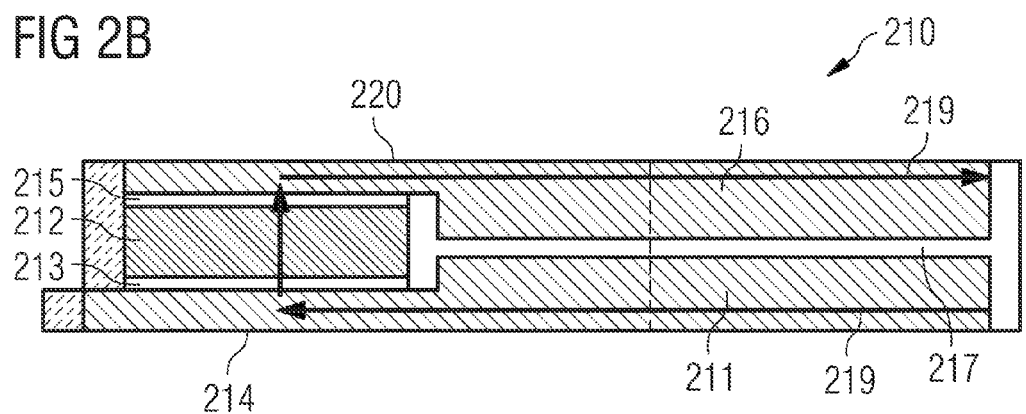

FIG. 2B shows a second principle layout of an electronic module 210 according to another exemplary embodiment. In general the layout is similar to the one shown in FIG. 2A. That is, the electronic module 210 comprises as well a first current path 211 which is soldered by a solder layer 213 to a transistor 212 and/or any other desired electronic component, like an electronic, semiconductor chip or diode chip or the like, which in turn is as well soldered by a solder layer 215 to a second current path 216 separated from the first current path 211 by a thin insulator 217.

In difference to the embodiment shown in FIG. 2A the one shown in FIG. 2B comprises straight (i.e. not bent or staggered) current paths, which as well form a first heatsink portion 214 and a second heatsink portion 220. Furthermore, it should be noted that the insulator 217 is not only formed between the two current paths but is also arranged on side portions of the electronic module as indicated in FIG. 2B on the right side. However, the insulator 217 may be arranged on two, three, several or all sides of the electronic module forming an insulating film for high voltage devices or applications.

Furthermore, arrows 219 depicted in FIG. 2B indicate the straight arrangement of the current paths and the resulting straight current flowing through the current paths. A further effect of the straight current paths may be that the second heatsink portion 220 is on the same level as the second current path 216 and the first heatsink portion 214 is on a same level as the first current path 211.

Figure 2C:
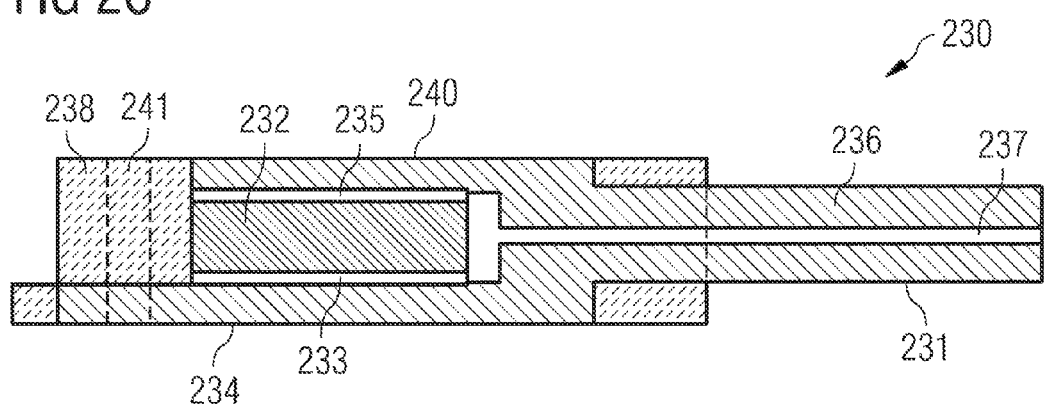

FIG. 2C shows a second principle layout of an electronic module 230 according to another exemplary embodiment. In general the layout is similar to the one shown in FIG. 2A. That is, the electronic module 230 comprises as well a bent first current path 231 which is soldered by a solder layer 233 to a transistor 232 and/or electronic chip which in turn is as well soldered by a solder layer 235 to a bent second current path 236 separated from the first current path 231 by a thin insulator 237.

In difference to the embodiment shown in FIG. 2A the one shown in FIG. 2C shows that not only the first current path 231 forms a first heatsink portion 234 but also the second current path 236 forms a second heatsink portion 240. Furthermore, an encapsulation 238 comprises a hole 241 which can be used for screwing or fixing the electronic module 230 to an external support or board. Such a screw hole may be used in particular in cases the electronic module has a double sided heatsink or double sided cooling.

Figure 2D:
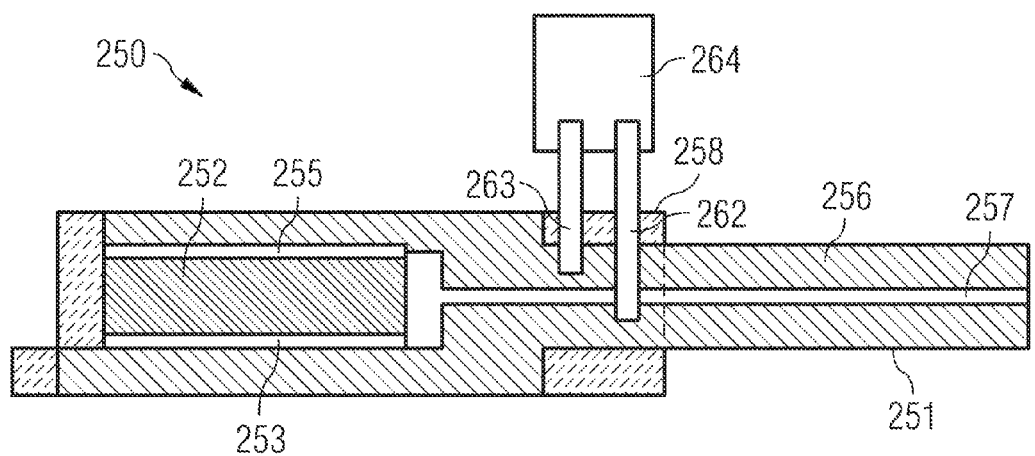

FIG. 2D shows a second principle layout of an electronic module 250 according to another exemplary embodiment. In general the layout is similar to the one shown in FIG. 2C. That is, the electronic module 250 comprises as well a first current path 251 which is soldered by a solder layer 253 to a transistor and/or another electronic chip or a plurality of electronic components 252 which in turn is as well soldered by a solder layer 255 to a second current path 256 separated from the first current path 251 by a thin insulator 257.

In difference to the embodiment shown in FIG. 2C the one shown in FIG. 2D comprises a first contact hole 262 and a second contact hole 263 through an encapsulation 258 contacting the first current path 251 and second current path 256, respectively. The contact holes can be used to electrically connect an external electronic component 264, e.g. a capacitor for standby power, to the first and second current paths, forming drain and source contacts, respectively, for example. Alternatively, the additional electronic component may be arranged in the encapsulation 258 as well.

With respect to all above described embodiments it should be mentioned that the general layout like terminal or lead configuration may be in principle unchanged with respect to the prior art with the only important provision that the first and second current paths (i.e. the source and drain in case a transistor is provided in the electronic chip) are preferably to be arranged in close proximity to each other.

FIGS. 3A to 3D schematically show details of electronic modules according to exemplary embodiments. In particular, FIG. 3A schematically illustrates that currents paths of an electronic module, which may be formed by conductor plates 301 may be pre-coated with a pre-coat 302 on all four outer sides, i.e. all sides of the plate which do not form a main surface of the plate, as well. The pre-coating may be performed before the pre-coated conductor plates are assembled to form part of an electronic module.

FIG. 3B schematically shows a detailed side view of an end of a first current path 311 and a second current path 316 having arranged an insulator 317 between them. As shown in FIG. 3B the ends of the currant paths or leads may have a tapered shape.

FIG. 3C schematically shows a detailed side view of an end of a first current path 321 and a second current path 326 having arranged an insulator 327 between them. However, in contrast to the ones shown in FIG. 3B the ends of the currant paths or leads have a rounded shape or forming a rounded edge.

In addition FIG. 3D shows a schematic top view of an end of a second current path 336 surrounded by an insulator 337. As shown in FIG. 3D the edges of the end of the second (and of course of a first current path not visible in the top view) may be rounded as well in a top view.

Figure 4:
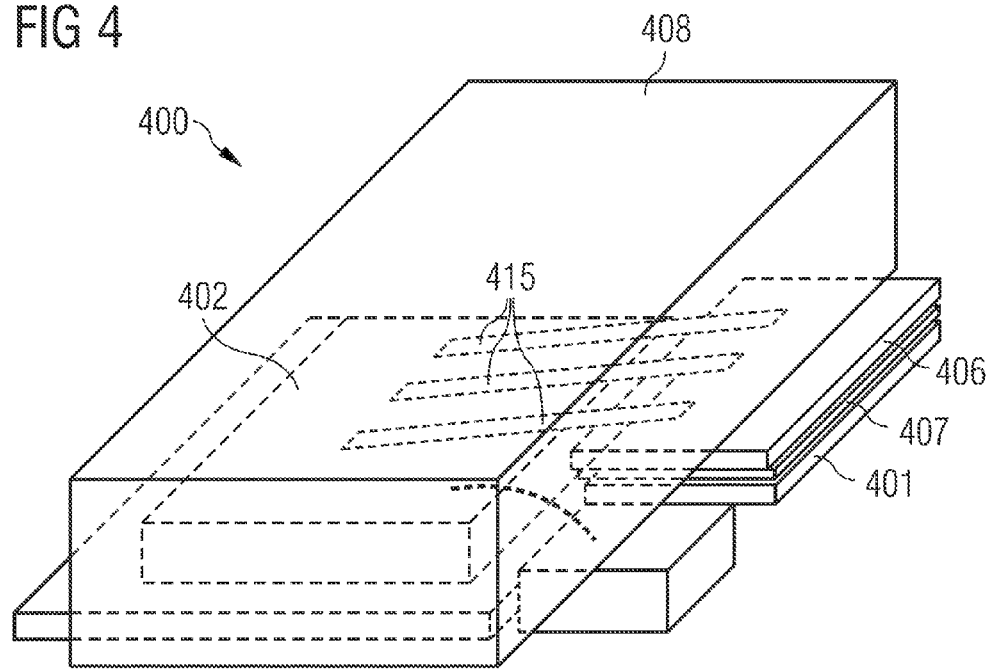
FIG. 4 schematically shows a perspective view of an electronic module according to an exemplary embodiment.

FIG. 4 schematically shows a perspective view of an electronic module 400 according to an exemplary embodiment. In particular, FIG. 4 shows the electronic module 400 comprising an encapsulation 408 which encloses an electronic chip or die 402 which is electrically connected to a second current path or plate 406 by wires 415. In addition, an insulator or insulating layer 407 is indicated in FIG. 4, which is arranged between the second current path 406 and a first current path 401.

Figure 5:
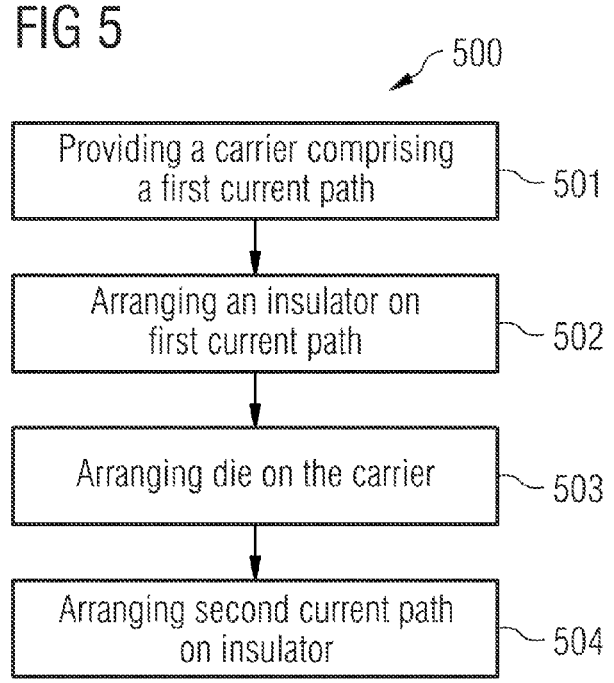
FIG. 5 shows a flowchart of a method of manufacturing an electronic module.

FIG. 5 shows a flowchart of a method 500 of manufacturing an electronic module. In a first step a carrier, e.g. a leadframe or another support structure comprising or consisting of copper for example, comprising a first current path is provided (step 501). In addition an insulator is arranged on the first current path (step 502). Thus, at least one side, e.g. a main surface, of the first current path is covered by an insulator or insulating layer. However, it should be noted that the first current path may be covered by the insulator on more than just one side. This forming of an insulation layer may also be some kind of (selective) pre-coating step, since it (at least partially) coats the first current path and optionally portions of the carrier as well.

Furthermore, an electronic chip or die is arranged on the carrier, which contacts the first current path to form an electrical contact and optionally a thermal contact (step 503). For example, the die may be connected to the carrier and/or first current path by any suitable bonding technique. Afterwards, a second current path is arranged on the insulator and contacts the electronic chip (step 504). This step may also be performed by any suitable method like soldering, wire bonding, clip bonding or the like.

It should be noted that the second current path is arranged or placed on top of the first current path in such a way that the first current path and the second current path are substantially coaligning with each other. It should be noted that all contacts; e.g. the contacting of the first current path to the electronic chip, the one between the electronic chip and the second current path; may be performed by any suitable bonding technique, e.g. soldering, wire bonding, clip bonding or the like.

Optionally a further step may be performed forming an encapsulation around the electronic chip and/or portions of the carrier. The encapsulation may be formed in a molding process or the like. In this encapsulation vias or holes may be formed which can be used for contacting elements or compounds in the encapsulation or as well for filling and degassing, e.g. in high voltage applications. Additionally a further optional step, a plating step may be performed used for providing electrical contacts to and from the electronic module.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic module, comprising:
   an electronic chip arranged in the electronic module and comprising an input terminal and an output terminal;
   a first current path electrically connected to the input terminal;
   a second current path electrically connected to the output terminal; and
   an insulation arranged between the first current path and the second current path,
   wherein the first current path and the second current path extend in the same direction and arranged in close proximity to each other;
   wherein the insulator is formed by an insulating layer having a thickness of less than 500 micrometer;
   wherein the first current path and the second current path each comprise a first portion which is connected to the electronic chip, and
   wherein the first current path and the second current path each comprise a second portion which is connected to the insulation;
   wherein at least one of the first current path and the second current path comprises a step between the first portion and the second portion; and
   wherein a distance between the first portion of the first current path and the first portion of the second current path is larger than a distance between the second portion of the first current path and the second portion of the second current path.

2. The electronic module according to claim 1, wherein the insulator is adapted to withstand a voltage of at least 100 V.

3. The electronic module according to claim 1, wherein the insulator comprises at least one material out of the group consisting of:
   silicon nitride;
   polyimide;
   fluorocarbon; and
   fluoropolymer.

4. The electronic module according to claim 1, wherein the electronic chip comprises a transistor and the first current path is connected to a first switched terminal of the transistor and the second current path is connected to a second switched terminal of the transistor.

5. The electronic module according to claim 1, wherein the first current path and the second current path are soldered to the electronic chip.

6. The electronic module according to claim 1, further comprising:
   a heatsink thermally connected to at least one of the first current path and the second current path.

7. The electronic module according to claim 1, further comprising an encapsulation encapsulating the electronic chip at least partially.

8. The electronic module according to claim 1, wherein the insulator is arranged on a side portion of the first current path.

9. The electronic module according to claim 1, wherein at least one of the first and second current paths is formed by a straight current path.

10. The electronic module according to claim 1, wherein the electronic module comprises a plurality of electronic chips each electrically connected to the first current path and the second current path.

11. The electronic module according to claim 7, wherein the electronic module further comprises a further electronic component arranged in the encapsulation.

12. The electronic module according to claim 7, wherein the encapsulation comprises a contact hole.

13. The electronic module according to claim 7, wherein the encapsulation comprises a fixing feature.

14. An electronic module, comprising:
a die arranged in the electronic module and comprising a first terminal and a second terminal;
a first current path electrically connected to the first terminal;
a second current path electrically connected to the second terminal and extending parallel to the first current path; and
an insulation arranged between the first current path and the second current path,
wherein a current in the first current paths flows in the opposite direction to a current flowing in the second current path;
wherein the insulator is formed by an insulating layer having a thickness of less than 500 micrometer;
wherein the first current path and the second current path each comprise a first portion which is connected to the die, and
wherein the first current path and the second current path each comprise a second portion which is connected to the insulation;
wherein at least one of the first current path and the second current path comprises a step between the first portion and the second portion; and
wherein a distance between the first portion of the first current path and the first portion of the second current path is larger than a distance between the second portion of the first current path and the second portion of the second current path.

* * * * *